(12) United States Patent
Shaban et al.

(10) Patent No.: US 8,558,432 B2
(45) Date of Patent: Oct. 15, 2013

(54) METHOD AND APPARATUS OF EXTRACTING AN IMMENSE ELECTRIC ENERGY FROM PIEZOELECTRIC MATERIALS IN A SUPER-GAIN ENERGY SYSTEM

(76) Inventors: Yasser Ragab Shaban, Sofia (BG); Milen K. Panteleev, Concord, CA (US)

(*) Notice: Subject to any disclaimer, the term of this patent is extended or adjusted under 35 U.S.C. 154(b) by 296 days.

(21) Appl. No.: 13/089,400

(22) Filed: Apr. 19, 2011

(65) Prior Publication Data
US 2012/0267984 A1    Oct. 25, 2012

(51) Int. Cl.
*H01L 41/113*    (2006.01)
(52) U.S. Cl.
CPC .................................... *H01L 41/113* (2013.01)
USPC ......................................................... 310/339

(58) Field of Classification Search
CPC .............. H01L 41/113; H01L 41/1132; H01L 41/1134; H01L 41/1136; H01L 41/1138
USPC ......................................................... 310/339
See application file for complete search history.

(56) References Cited

U.S. PATENT DOCUMENTS

2009/0167114 A1* 7/2009 Sapir ............................ 310/339
2013/0161957 A1* 6/2013 Bhat et al. ....................... 290/53

* cited by examiner

*Primary Examiner* — Derek Rosenau

(57) ABSTRACT

The aim of the present invention is the uses of a modified hydraulic press to generate electric power. The electric power is generated by two arrays of piezoelectric cells placed at the top and bottom of the larger unit. The new modification of the hydraulic press is based on the restoration of the potential energy of the larger unit.

3 Claims, 9 Drawing Sheets

METHOD AND APPARATUS OF EXTRACTING AN IMMENSE ELECTRIC ENERGY FROM PIEZOELECTRIC MATERIALS IN A SUPER-GAIN ENERGY SYSTEM

CROSS-REFERENCE TO RELATED APPLICATIONS

Not Applicable

STATEMENT REGARDING FEDERALLY SPONSORED RESEARCH OR DEVELOPMENT

Individual Efforts

BACKGROUND

The hydraulic press is a device of lifting a massive weight to a shorter distance by the application of moderate force to a longer distance. Such principal is known since the ancient Egyptians (build of pyramids). However, it is revealed in the modern times by Balise Pascal (1623-1662), and since that time it is known as PascalPrinciple: any change in the pressure applied to an enclosed fluid is transmitted to every portion of the fluid and to the walls of the containing vessel. The hydraulic press is used in the present time for dozens of applications such as lifting cars, bending and cutting tough metals, etc. The use of the hydraulic press, which is named in the present invention: super-gain energy system, to produce electricity from piezoelectric material is a new application as presented here.

BRIEF DESCRIPTION OF DRAWINGS

Figures included in this invention are briefly described as follows.

FIG. 10 illustrates the hydraulic press in the charge mode i.e. during load-on.

SUMMARY OF THE INVENTION

One embodiment of the present invention is the modification of the concept of hydraulic press to include the restoration of potential energy, thus adding a massive energy at the exit unit.

A second embodiment is the use of the hydraulic press to generate electric energy from piezoelectric materials placed at the upper portion of the exit unit during charge (load), i.e. at normal operation of hydraulic press.

A third embodiment of the present invention is the use of the modified hydraulic press to generate electric energy from piezoelectric materials based on restoration of the potential energy at the lower point of the exit unit during discharge (load-off).

Figure 1:
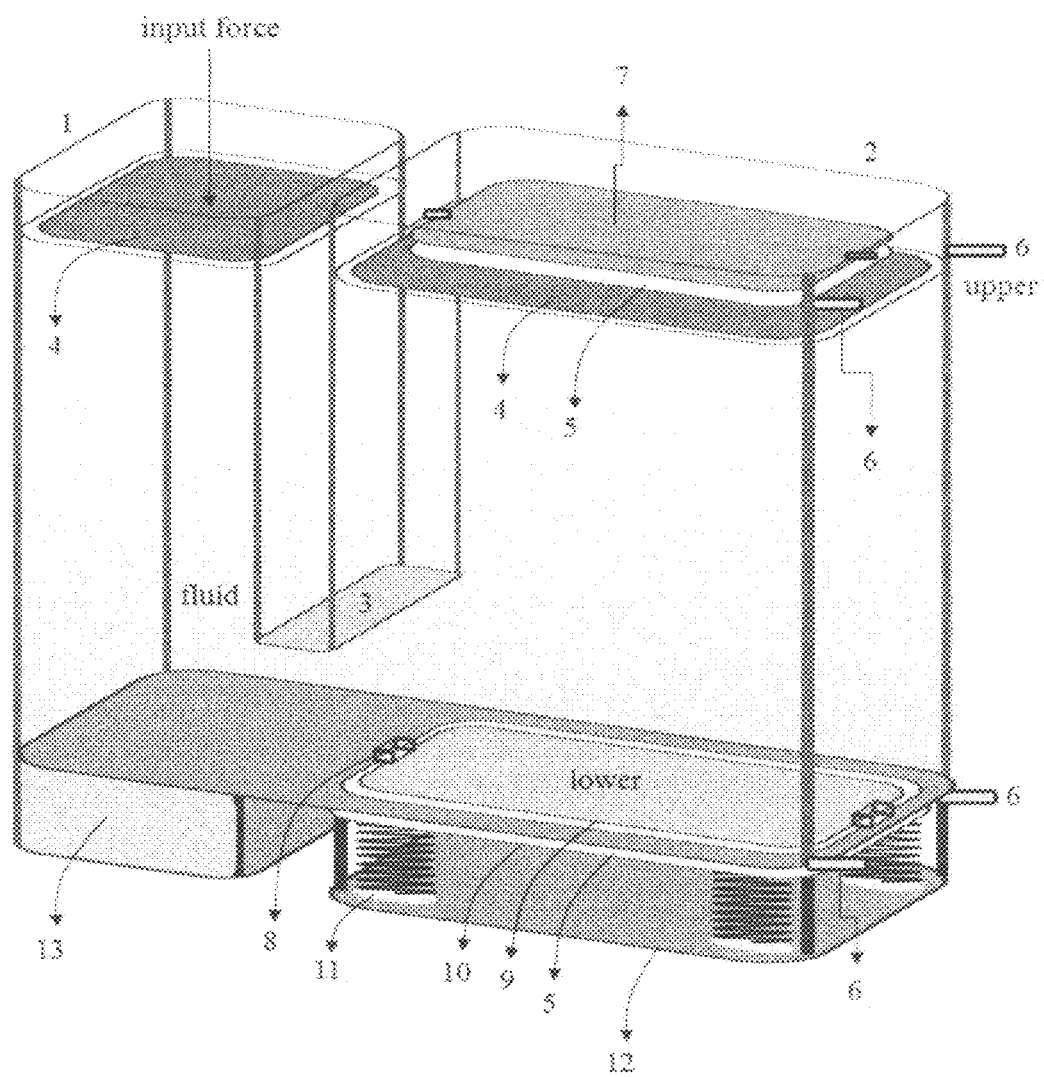
FIG. 1 outlines a three-dimensional view of the super-gain energy system. The modification of the hydraulic press is introduced at the lower part of the exit unit.
Figure 2:
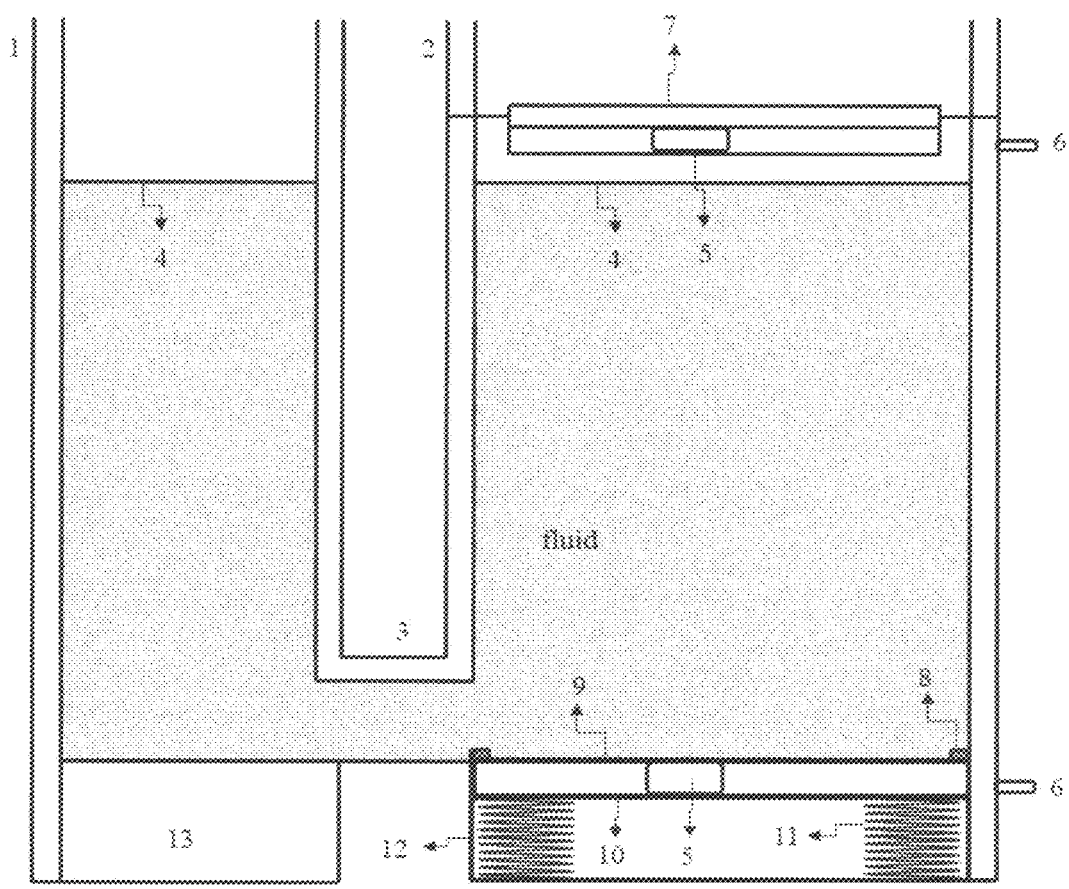
FIG. 2 illustrates a side view of the super gain energy system. One piezoelectric cell is shown only.

The super-gain energy system, modified hydraulic press, comprises the following elements as indicated by their numbers in FIGS. 1 and 2: an inlet unit (shown rectangular) with smaller cross section (1) with one end opened to the incoming external force, an exit unit (shown rectangular) with larger cross section area (2) opened at two ends: one end to the atmosphere from the upper portion which includes the upper energy extractor and the other end is opened to the lower energy extractor, a bridge (3) between units (1) and (2) at the bottom end, a piston (4) in each unit, an array of piezoelectric cells (5) fixed at the bottom of a tray (7) made from electric insulated material with smaller cross section area than the piston of the larger unit: the tray with the cells are placed above the piston of the larger unit and fixed to the structure of the unit (2), an upper collecting electrodes (6), a lower energy extractor (12) shaped as a basin comprises the following elements: an electromechanical switch (8), a lower piston (9) is electric insulator made of lighter material grasped by element (8), four stiff springs (11), a tray (10) is an electric insulator made of heavier material than element (9), further elements (9) and (10) have the same volume, an array of lower piezoelectric cells (5) sandwiched between elements (9) and (10), further the try is fixed to element (11), further element (9) is slightly loose from elements (5) and (10), a lower collecting electrodes, and a unit (13) which acts as a balancing unit to the right portion of the whole unit. The super-gain energy system is filled with incompressible fluid such as oil.

DETAILED DESCRIPTION OF THE INVENTION

I) The Concept of the Invention

When a piezoelectric ceramic (or material) is stressed mechanically by a force, it generates an electric charge . When a force applied perpendicular to a piezoceramic sandwiched between two electrodes it causes a charge production and a voltage at the electrodes. The electric charge and voltage are directly proportional to the applied force. The greater is the applied force, the greater is the output electric energy.

In this patent, we refer to the piezoelectric cell to which it includes a piezoceramic or material sandwiched between two electrodes. The piezoelectric cell can be of one layer or a laminated multi-layer. The multi-layer piezoelectric cell is a very stiff structure with a high capacitance. It is suitable for handling high force and collecting a large quantity of charge efficiently.

In a typical hydraulic press, one part of the system is a piston acting as a pump, with modest mechanical force (denoted Fi) acting on a small cross-sectional area; the other part is a piston with a larger cross-sectional area which generates a correspondingly large mechanical force (denoted Fe). The exit mechanical force Fe shifts the piston upward to a smaller distance. In a typical hydraulic press, the energy is extracted at the upward of the larger cross-sectional area.

In the present invention, a modification in the concept of hydraulic press is introduced at the bottom of the exit unit in order to extract a stored energy after the piston of the exit unit competes its maximum motion at the upper part. Normally, the potential energy stored in the exit unit is wasted during the relief of the whole unit. Since we extract a minimum volume of thickness δ (as denoted in the diagrams) from the bottom of the exit unit; the unit-relief is insignificantly delayed, but this depends on the response of the stiff springs with respect to the rising speed of the fluid at the inlet unit.

Such modification allows us to extract energy from the lower portion of the exit unit, in addition to the extracted energy from the upper portion, hence summing an energy gain to the system. For this reason, the new version of hydraulic press is titled; a super-gain energy system.

Principally, by placing several piezoceramic cells arranged in series or parallel (or combined) at the upper and lower portions of the exit unit in the configuration of hydraulic press, then during charge (load-on) and discharge (load-off) operations both arrays gain one free energy in one cycle in which the whole unit can be self-sustained without the need of external energy. A typical compression of the piezoceramic is in the range of micrometers, general speaking.

II) The Super-Gain Energy System

The super-gain energy system is illustrated in FIG. 1, a three-dimensional view, and in FIG. 2, a side view. The energy that is extracted from the super-gain energy system during load-on operation at the exit unit is called the upper energy extractor. On the other hand, the energy that is extracted from the super-gain energy system during load-off operation at the exit unit is called the lower energy extractor. The later includes several new elements added to the general concept of the hydraulic press. The inlet unit (1) is shaped cylindrically or rectangularly with smaller cross section area. The exit unit (2) is shaped similar to unit 1 but with larger cross section area. The inlet unit is opened from the side of the incoming force at the upper end with a movable piston (4) located on top of the fluid. The other end of the inlet unit is tunneled to unit 2 by a bridge (3). The exit unit (2) is opened from two ends: upper and lower. The upper end includes a moveable piston (4) and lower end includes a moveable piston (9) but controlled electromechanically. Both units 1 and 2 are filled with incompressible fluid, e.g. oil, constrained between the pistons (4) of both units. Both units are shown in a rectangular view and not in a design-view, the common design is the cylindrical geometry.

Figure 3:
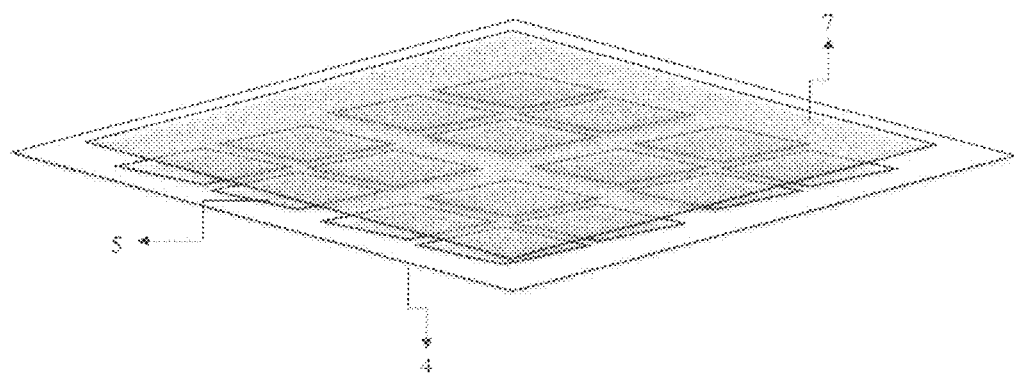
FIG. 3 illustrates the upper unit of the piezoelectric cells. The piezoelectric cells are shown between the piston of the exit unit and the stopper.

The upper energy extractor is composed of an array of piezoceramic cells (or piezoelectric materials) fixed at one side of a tray (7), i.e. from the side facing the piston (4). To insure that the exit unit from the upper end is subject to the atmospheric pressure; the cross section area of the tray (7) has a smaller cross section area than the cross section area of the piston (4) of the larger unit. The tray 7 is fixed to the structure of the exit unit 2. The configuration of the upper piezoelectric cells is shown in FIG. 3. In addition, the tray (7) is made of insulated material to avoid any electric contact with the electrodes of The piezoelectric cells. The produced electric energy and power are collected by a pair of electrodes (6) fixed to the structure of the exit unit 2. When the unit (1) is under load its piston moves downward and pushing the fluid in the exit unit upward. As a result, the piston (4) of the exit unit moves upward and compresses the piezoceramic cells. The electric energy and power are produced from the piezoelectric cells soon after the piston in the exit unit moves downward to let the cells restoring its normal orientation.

Figure 4:
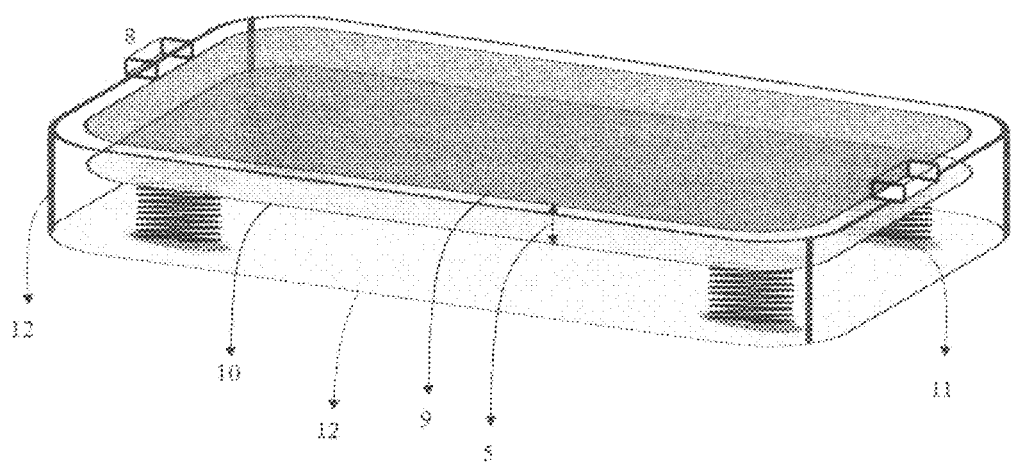
FIG. 4 illustrates a three-dimensional view of the lower unit of the piezoelectric cells. The lower unit includes several elements that are introduced to the hydraulic press in order to extract (restore) the potential energy of the exit unit during discharge of the load.
Figure 5:
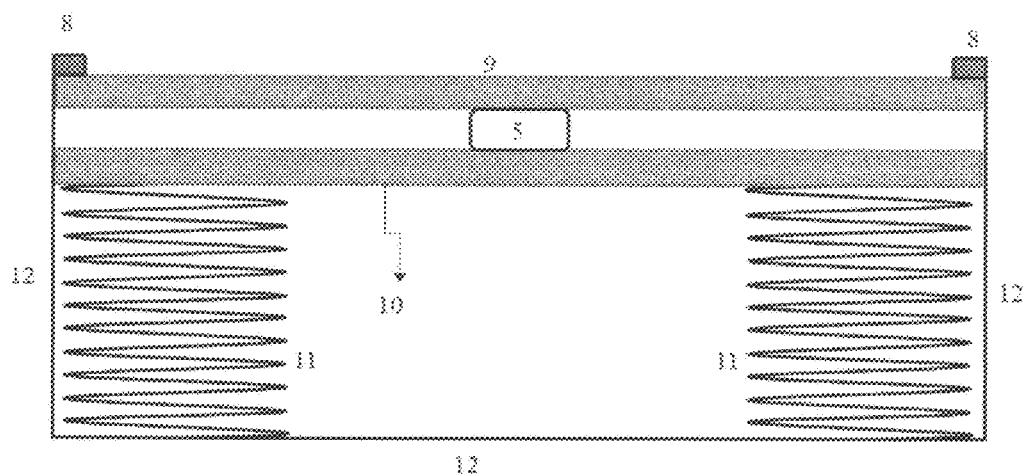
FIG. 5 illustrates a side view of the lower unit of the piezoelectric cells.
Figure 6:
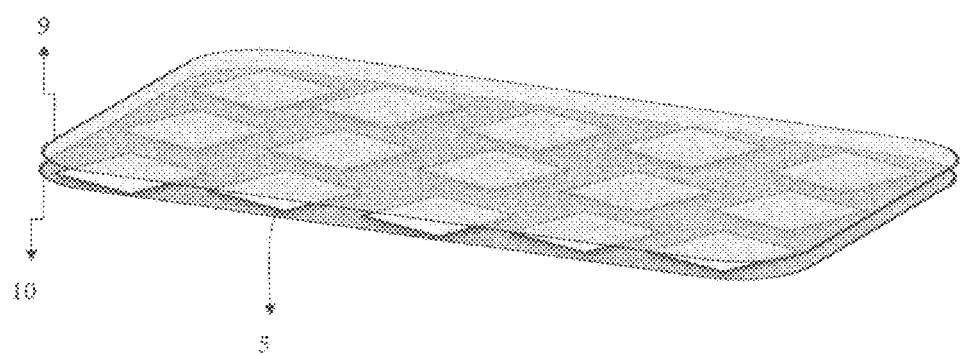
FIG. 6 illustrates the positions of the lower piezoelectric cells sandwiched between the lower piston and the tray.
Figure 7:
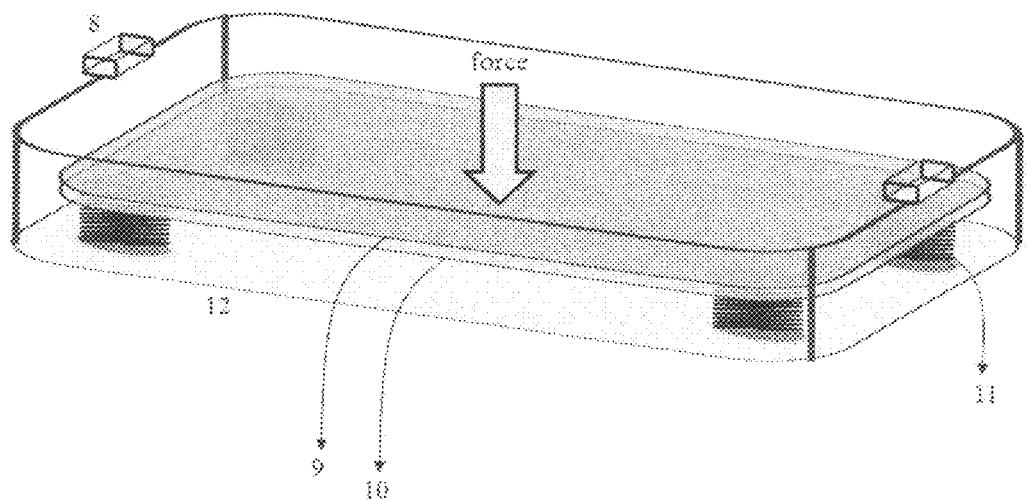
FIG. 7 illustrates a three-dimensional view of the lower unit during compression.
Figure 8:
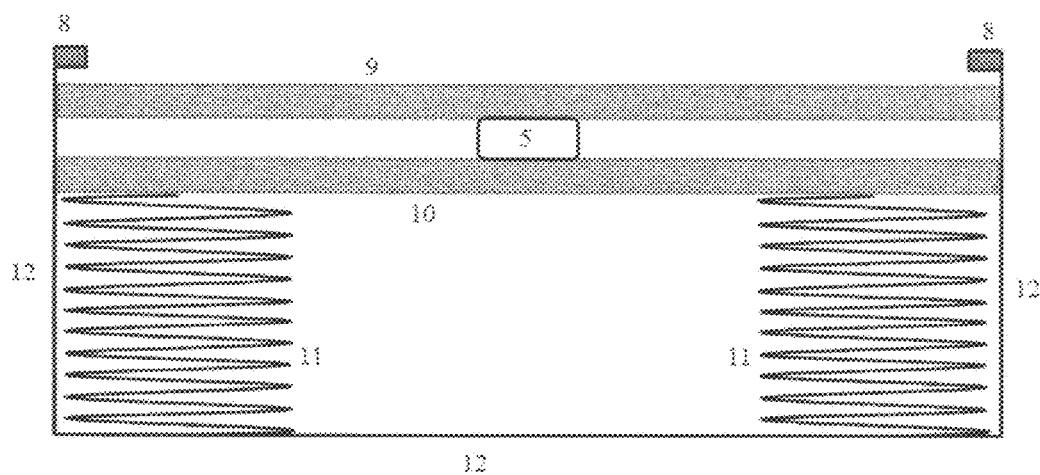
FIG. 8 illustrates a side view of the lower unit during compression.

The lower energy extractor is shown in FIG. 4, a three-dimensional view and in FIG. 5, a side view. It is composed of a basin-shape (12) without fluid filling. The basin contains four stiff springs (11) fixed to the inner structure. Further, a tray (10) made of insulated material is fixed to the top of the stiff springs. Further, an array of piezoelectric cells (5) are fixed to the structure of the tray (10) from one side and partially fixed to a piston (9) from the other side. Further, the piston (9) is made of insulated material but it has a lesser density than the tray (10). Both elements 9 and 10 have the same volume, thus element 9 is lighter than element 10. FIG. 6 illustrates the position of the piezoelectric cells between the lower piston (9) and the tray (10). Further, the piston (9) is grasped by an electromechanical switch (8) which is fixed to the structure of the exit unit. The lower piston (9) and the tray (10) with the piezoelectric cells are joined as one unit but it is slightly loose from the side of the piston (9). When the electromechanical switch is closed, the lower unit is not moving downward. The generated electric energy and power from the lower unit are collected by a pair of electrodes (6) fixed at the structure of the bottom of the exit unit. When the piston (4) of the exit unit reaches to its maximum motion; the external force in the inlet unit is relieved: by lifting the load up in case of applying a conventional weight or by de-pressurizing the gas from the inlet unit in case if the applied force comes from a compressed gas. At this moment, the switch (8) releases the piston (9) with its associated components (10 and 5) thus it relaxes down with the weight of the fluid as shown in FIGS. 7 and 8. Due to the stiffness of the springs, the falling height is very much small (it is shown big for the purpose of demonstration). The falling height is determined by the design and the strength of the springs. When the inlet unit reaches just to the datum line (load-off), the springs restore its normal configuration. Since the piston (9) is made from lighter material and because it is slightly loose from the lower unit, it will reach to the position of element 8 before the other components. Consequently, the tray with the piezoelectric cells will then hit the piston as soon as the springs restore a complete restoration. Therefore, the piezoelectric cells are stressed between the stiff springs (11) and the tray (10) from one side, and the piston (9) from the other side. The lesser is the falling height of the springs, the greater is the applied force to the piezoelectric cells, and the greater is the extracted electric energy. The falling height of the springs should be kept in the order of the maximum compression δ of the piezoelectric cell.

III) The Charging Operation: Load-On

Figure 9:
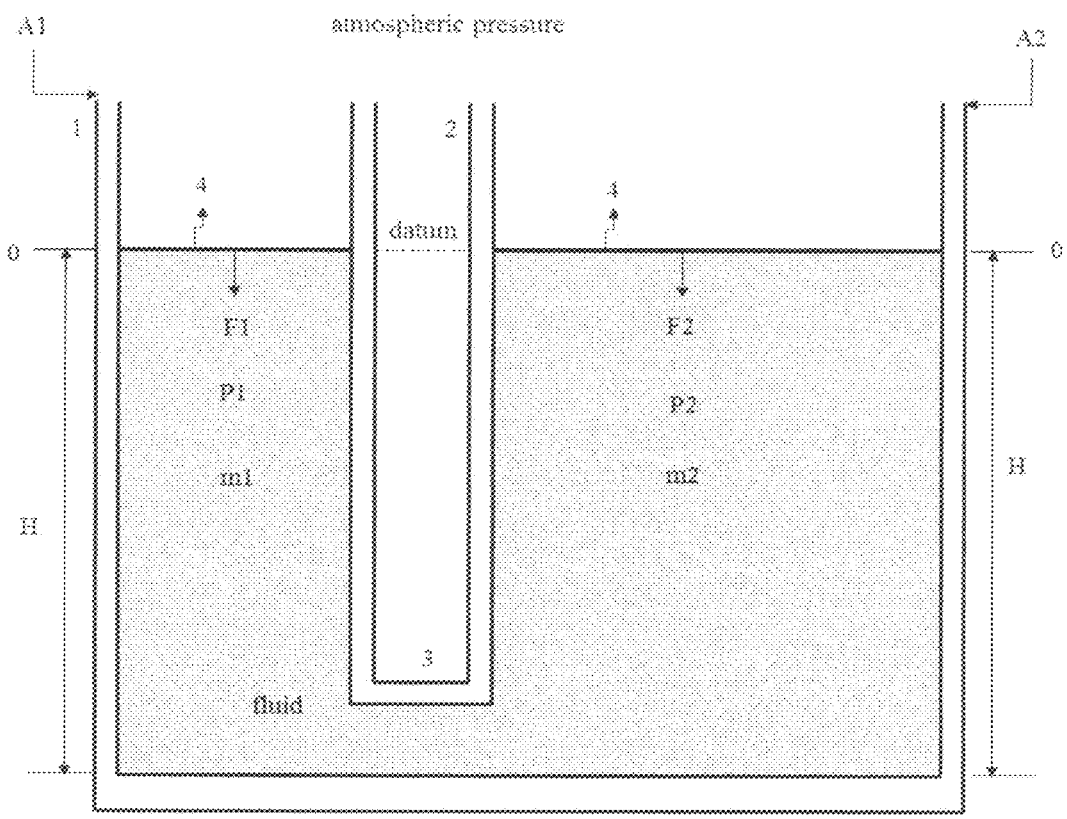
FIG. 9 illustrates a simple unit of hydraulic press with basic components. The unit is subject to atmospheric pressure.

Consider the case of a typical hydraulic press without the installation of the piezoelectric cells. FIG. 9 illustrates the basic of a hydraulic press in normal condition, i.e. without any load. The inlet unit, left column (1), has a cross section A1 and mass m1. The exit unit, right column (2), has a cross section A2 and mass m2. The right column has a larger cross section area and greater mass than the corresponding parameters at the left column. The heights of both columns are equal to H. The datum of both columns is referenced to zero (denoted 0 in the diagram). The static force exerted downward F1 is equal to $$F1 = m1 \times g \qquad 1$$

Where g is the acceleration constant (=9.82 m/s²). The static force F2 at the left column, exerted downward is equal to $$F2 = m2 \times g. \qquad 2$$

The pressure P1 exerted from the left column to the right column is equal to the pressure P2 exerted from the right column to the left unit. That is;

$$P1=P2. \qquad 3$$

In terms of force and area, the above equation is equal to $$(F1/A1)=(F2/A2). \qquad 4$$

Figure 10:
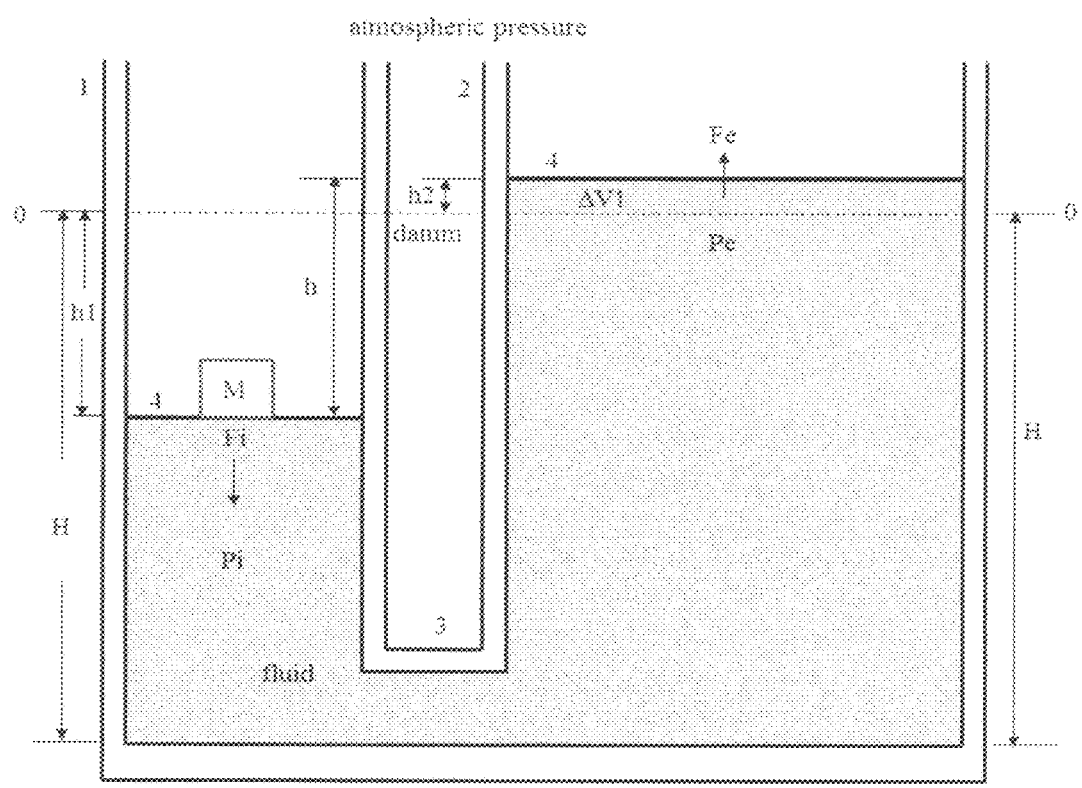

Consider a load M in kilograms placed at the top of the piston of the left column. The fluid in the hydraulic press is responded by moving toward the right column as shown in FIG. 10. The level of the fluid in the left column is dropped below the datum line by a height equal to h1. On the other hand. the level of the fluid in the right column is raised above the datum line to a new height equal to h2. The new pressure Pi (force per unit area) due to load M, exerted from the left column to the right column in this case is greater than P2, and thus the direction of the new force at the exit unit Fe is upward. The total head, denoted h in the diagram, is found as follows $$Pi=\rho \times g \times h. \qquad 5$$

Where: Pi is the inlet pressure due to the load M, and $\rho$ is the density of the fluid. Since Pi is caused by the load M, hence Equation 5 becomes $$(M/A1) \times g = (\rho \times g \times h). \qquad 6$$

By cancelling the acceleration constant g, then Equation 8 becomes $$(M/A1)=(\rho \times h). \qquad 7$$

From FIG. 10, h is equal to $$h=h1+h2. \qquad 8$$

The value of the upward force Fe in the exit unit is caused by the application of the load M. The pressure Pi exerted by the load M in the inlet unit is equal to (M×g/A1) and the exit pressure Pe is equal to Fe/A2. Both pressures are equal, hence $$(M \times g)/A1=(Fe/A2). \qquad 9$$

Then Fe, the upward force, at the exit unit is equal to $$Fe=(A2/A1) \times M \times g. \qquad 10$$

The exit energy Fe is given by $$Ee=Fe \times h2. \qquad 11$$

The volume of the drifted fluid ΔV1(=A2×h1) times the density of the fluid is equal to the mass of the load M. The conservation of volume (ΔV1=ΔV2) leads to $$A1 \times h1 = A2 \times h2. \qquad 12$$

Figure 11:
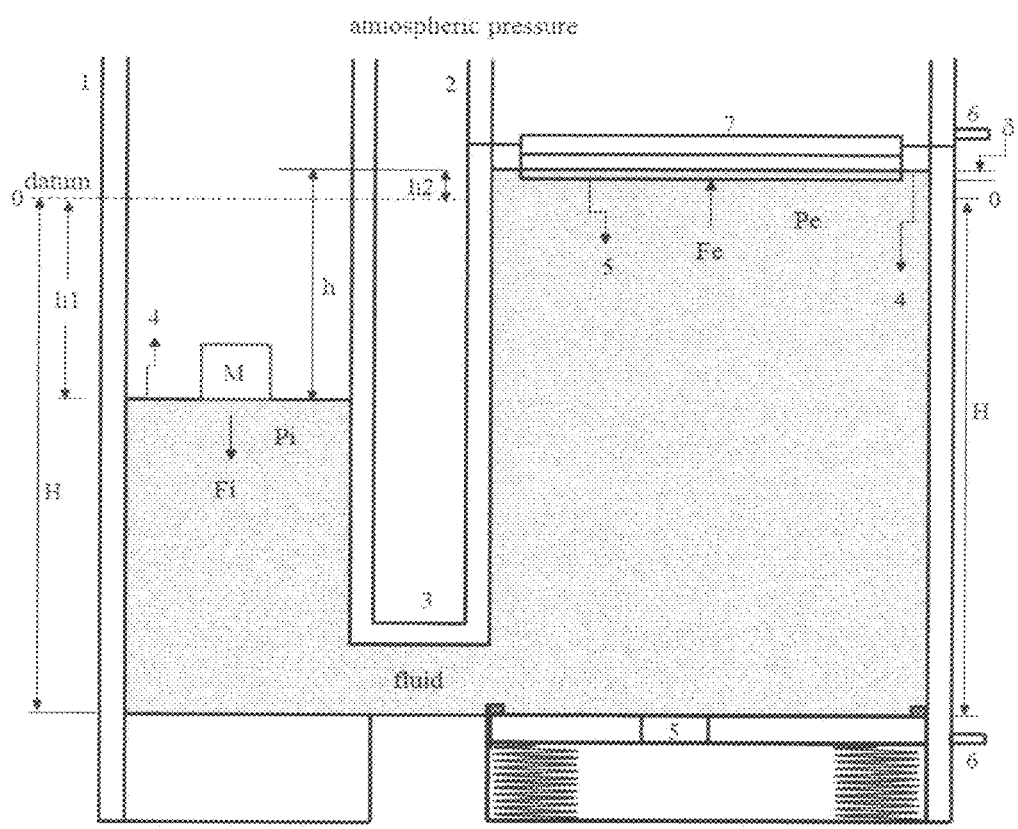
FIG. 11 illustrates the configuration of the super-gain energy system under a load. The electric energy is extracted from the upper part of the exit unit.

The exit energy given by Equation 11 is free since it resulted from the weight of the load M. Because of the conservation of mass, we conclude from Equation 10, the exit force is a weight. denoted M2, M2(=(A2/A1)×M). Such weight is directed upward and it must be resulted from the weight or the mass of exit unit which is denoted m2. That is the exit weight, M2, could be any value less than m2 but it cannot exceed the maximum value, i.e. when M2 equals m2. The inserted weight is actually lifting the right column of mass m2 at the exit unit to a height h2 above the datum. Therefore for the upper energy extractor, the position of the tray 7 with the piezoelectric cells is adjusted to a distance δ below final point of the piston as shown in FIG. 11. Thus during charging, load-on, the piston of the exit unit moves upward meeting piezoelectric cells and pushing (compressing) to a distance equal to δ. So out of the exit energy given by Equation 11, only a fraction Fe×δ is useful to the piezoelectric cells.

Therefore, it is better to select the operational conditions of the super-gain energy system so that the optimum condition is reached when δ equals to h2.

IV) The Discharging Operation: Load-Off

To get the whole unit into normal condition we need to supply the inlet unit with energy in order to relieve it from the excess force. This is done by lifting the load M to the datum line. If the system is operating with compressed gas, the relief of the excess pressure is performed by de-pressuring the unit to the atmospheric pressure. In that case, the energy is paid during the compression operation.

For when the external force is performed through a conventional weight M, the relief of the weight must be supplied by an energy equals M×g×h1 which is equal to the exit energy given by Equation 11.

The precious outcome of the unit-relief is that, a downward energy could be utilized for a fraction of second depending on the design of the springs. In the typical hydraulic press, the right column is lifted with less force but with equal energy in the inlet and exit units, no question about it. However, the right column of H height and cross section A2 of mass m2 is above the ground of the right column by a height h2. During falling, the downward energy Ep is equal to $$Ep=m2 \times g \times h2. \qquad 13$$

Figure 12:
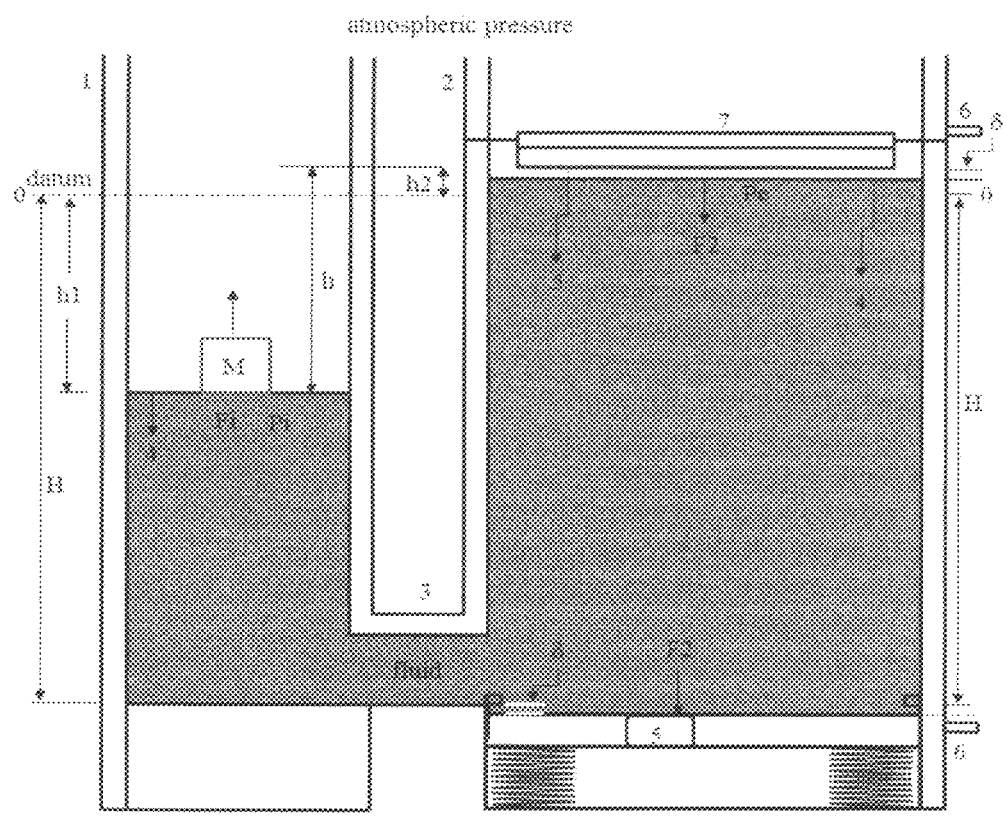
FIG. 12 illustrates the configuration of the super-gain energy system when the unit is relieved from the load. The electric energy is extracted from the lower part of the exit unit during load-off.

The downward force is equal to F2 (=m2×g) and the downward weight is equal to m2. If comparison is made between the upward and downward operation, we see that the energy given by Equation 13 is greater than the energy given by Equation 11. The downward force F2 is greater than the force Fe given by Equation 10. While the downward parameters depend on the volume of the system, the upward parameters depend on the surface of the system. The lower energy extractor should be designed so the piston (9) with the components 10 and 5 fall to a distance equal to δ as shown in FIG. 12. For an optimum condition, h2 should be designed to be on the order of δ. So out of the energy given by Equation 13, only a fraction of m2×g×δ is useful to the piezoelectric cells The net energy gained En in the super-gain energy system is equal to $$En=m2 \times g \times h2-Ei. \qquad 14$$

Where: Ei is the input energy which is equal to M×g×h1 in case if conventional weight is applied. So by placing an array of piezoelectric cells in the upper portion of the exit unit and at the bottom of the exit unit, an immense electric energy would be extracted during charging and discharging operations. The extracted electric power depends on the how fast the cycle is operation of the system.

The new discovery is a breakthrough in green-energy since it is possible to build an electric power plant with piezoelectric materials for the first time.

What is claimed is:

1. An inlet unit shaped cylindrically or rectangularly with smaller cross sectional area with one end opened to the incoming external force, and an exit unit shaped similarly to the inlet unit, but with larger cross sectional area, wherein the inlet unit and exit unit are linked through a tunnel or bridge, and both the inlet unit and the exit unit are filled with an incompressible fluid; the inlet unit comprises a piston and the exit unit comprises an upper piston and a lower piston; the exit unit is open to the atmosphere at an upper portion, which includes an upper energy extractor, and a lower portion, which is open to a lower energy extractor; wherein the upper energy extractor comprises: an array of piezoelectric cells fixed at one side to an upper tray of the exit unit, wherein the upper tray of the exit unit is stationary, the upper tray of the exit unit is fixed above the upper piston of the exit unit, the upper tray of the exit unit is made from an electrically insulating material with smaller cross sectional area than the upper piston of the exit unit; and a plurality of upper collecting electrodes; wherein the lower energy extractor comprises: an unfilled basin, the basin further comprising: an electromechanical switch which grasps the lower piston of the exit unit, wherein the lower piston of the exit unit is made from an electrically insulating material, and moves freely up and down; a lower tray of the exit unit, which is made from an electrically insulating material, but heavier than the lower piston of the exit unit; and a plurality of lower collecting electrodes, wherein the lower tray and the lower piston of the exit unit have equal volumes, and the lower tray is fixed to several coil springs, the coil springs being fixed to the bottom of the basin, and wherein an array of piezoelectric cells is sandwiched between the lower piston and the lower tray of the exit unit.

2. The apparatus of claim 1, further comprising the uses of the present invention to extract electric power from the upper and lower piezoelectric cells during load-on from the upper energy extractor and load-off from the lower energy extractor in which the downward energy is realized.

3. An apparatus, of claim 1 comprising a unit of the lower energy extractor to extract the downward energy from the bottom of the exit unit.

* * * * *